United States Patent
Lipkin et al.

(10) Patent No.: US 6,767,843 B2
(45) Date of Patent: Jul. 27, 2004

(54) METHOD OF N$_2$O GROWTH OF AN OXIDE LAYER ON A SILICON CARBIDE LAYER

(75) Inventors: Lori A. Lipkin, Raleigh, NC (US); Mrinal Kanti Das, Durham, NC (US); John W. Palmour, Raleigh, NC (US)

(73) Assignee: Cree, Inc., Durham, NC (US)

(*) Notice: Subject to any disclaimer, the term of this patent is extended or adjusted under 35 U.S.C. 154(b) by 0 days.

(21) Appl. No.: 09/968,391

(22) Filed: Oct. 1, 2001

(65) Prior Publication Data

US 2002/0072247 A1 Jun. 13, 2002

Related U.S. Application Data

(63) Continuation-in-part of application No. 09/834,283, filed on Apr. 12, 2001.
(60) Provisional application No. 60/294,307, filed on May 30, 2001, provisional application No. 60/237,822, filed on Oct. 3, 2000, and provisional application No. 60/237,426, filed on Oct. 3, 2000.

(51) Int. Cl.$^7$ ............................................. H01L 21/31
(52) U.S. Cl. ........................ 438/758; 438/770; 257/77
(58) Field of Search .............................. 438/758, 770, 438/244, 275, 285; 257/77

(56) References Cited

U.S. PATENT DOCUMENTS

| | | | |
|---|---|---|---|
| 3,924,024 A | 12/1975 | Naber et al. | 427/95 |
| 4,466,172 A | 8/1984 | Batra | 29/571 |
| 4,875,083 A | 10/1989 | Palmour | 357/23.6 |
| 5,170,231 A | 12/1992 | Fujii et al. | 357/23.2 |
| 5,170,455 A | 12/1992 | Goossen et al. | 385/89 |
| 5,184,199 A | 2/1993 | Fujii et al. | 29/10 |
| 5,479,316 A | 12/1995 | Smrtic et al. | 361/322 |
| 5,506,421 A | 4/1996 | Palmour | 257/77 |
| 5,510,630 A | 4/1996 | Agarwal | 257/77 |
| 5,587,870 A | 12/1996 | Anderson et al. | 361/313 |
| 5,726,463 A | 3/1998 | Brown et al. | 257/77 |

(List continued on next page.)

FOREIGN PATENT DOCUMENTS

| | | |
|---|---|---|
| DE | 198 09 554 | 9/1998 |
| DE | 19900171 | 12/2000 |
| DE | 10036208 | 2/2002 |
| EP | 0 637 069 A1 | 2/1995 |
| EP | 0 637 069 B1 | 1/2001 |
| JP | 03157974 | 7/1991 |
| JP | 08264766 | 10/1996 |
| JP | 09205202 | 8/1997 |
| JP | 11191559 | 7/1999 |
| JP | 11238742 | 8/1999 |

(List continued on next page.)

OTHER PUBLICATIONS

M.K. Das, L.A. Lipkin, J.W. Palmour, G.Y. Chung, J.R. Williams, K. McDonald, and L.C. Feldman, "High Mobility 4H–SiC Inversion Mode MOSFETs Using Thermally Grown, NO Annealed SiO$_2$," IEEE Device Research Conference, Denver, CO Jun. 19–21, 2000.

(List continued on next page.)

Primary Examiner—John F. Niebling
Assistant Examiner—Olivia T. Luk
(74) Attorney, Agent, or Firm—Myers Bigel Sibley & Sajovec, P.A.

(57) ABSTRACT

Methods for fabricating a layer of oxide on a silicon carbide layer are provided by forming the oxide layer on the silicon carbide layer by oxidizing the silicon carbide layer in an N$_2$O environment. A predetermined temperature profile and/or a predetermined flow rate profile of N$_2$O are provided during the oxidation. The predetermined temperature profile and/or predetermined flow rate profile may be constant or variable and may include ramps to steady state conditions. The predetermined temperature profile and/or the predetermined flow rate profile are selected so as to reduce interface states of the oxide/silicon carbide interface with energies near the conduction band of SiC.

28 Claims, 14 Drawing Sheets

U.S. PATENT DOCUMENTS

| | | | |
|---|---|---|---|
| 5,739,564 A | 4/1998 | Kosa et al. | 257/298 |
| 5,763,905 A | 6/1998 | Harris | 257/77 |
| 5,837,572 A | 11/1998 | Gardner et al. | 438/199 |
| 5,877,045 A | 3/1999 | Kapoor | 438/151 |
| 5,885,870 A * | 3/1999 | Maiti et al. | 438/261 |
| 5,939,763 A | 8/1999 | Hao et al. | 257/411 |
| 5,960,289 A | 9/1999 | Tsui et al. | 438/257 |
| 5,972,801 A | 10/1999 | Lipkin et al. | 438/770 |
| 6,025,608 A | 2/2000 | Harris et al. | 257/77 |
| 6,028,012 A | 2/2000 | Wang | 438/779 |
| 6,048,766 A | 4/2000 | Gardner et al. | 438/257 |
| 6,054,352 A | 4/2000 | Ueno | 438/268 |
| 6,063,698 A | 5/2000 | Tseng et al. | 438/585 |
| 6,096,607 A | 8/2000 | Ueno | 438/522 |
| 6,100,169 A | 8/2000 | Suvorov et al. | 438/519 |
| 6,107,142 A | 8/2000 | Suvorov et al. | 438/285 |
| 6,117,735 A | 9/2000 | Ueno | 438/268 |
| 6,136,728 A | 10/2000 | Wang | 438/773 |
| 6,165,822 A | 12/2000 | Okuno et al. | 438/142 |
| 6,190,973 B1 | 2/2001 | Berg et al. | 438/275 |
| 6,204,203 B1 * | 3/2001 | Narwankar et al. | 438/785 |
| 6,211,035 B1 * | 4/2001 | Moise et al. | 438/396 |
| 6,221,700 B1 | 4/2001 | Okuno et al. | 438/151 |
| 6,228,720 B1 | 5/2001 | Kitabatake et al. | 438/268 |
| 6,238,967 B1 | 5/2001 | Shiho et al. | 438/244 |
| 6,239,463 B1 | 5/2001 | Williams et al. | 257/328 |
| 6,246,076 B1 | 6/2001 | Lipkin et al. | 257/77 |
| 6,316,791 B1 | 11/2001 | Schorner et al. | 257/77 |
| 6,344,663 B1 | 2/2002 | Slater, Jr. et al. | 257/77 |
| 6,455,892 B1 | 9/2002 | Okuno et al. | 257/328 |
| 6,297,172 B1 | 10/2002 | Kashiwagi | 438/773 |
| 6,593,620 B1 | 7/2003 | Hshieh et al. | 257/335 |
| 2001/0055852 A1 * | 12/2001 | Moise et al. | 438/396 |
| 2002/0072247 A1 | 6/2002 | Lipkin et al. | 438/767 |

FOREIGN PATENT DOCUMENTS

| | | |
|---|---|---|
| JP | 11261061 | 9/1999 |
| JP | 11266017 | 9/1999 |
| JP | 11274487 | 10/1999 |
| JP | 2000049167 | 2/2000 |
| JP | 2000082812 | 3/2000 |
| JP | 0200025246 | 9/2000 |
| JP | 20000106371 | 4/2001 |
| WO | WO 97/17730 | 5/1997 |
| WO | WO 97/39485 | 10/1997 |
| WO | WO 98/02924 | 1/1998 |
| WO | WO99/63591 | 12/1999 |
| WO | WO 99/63591 | 12/1999 |
| WO | WO 00/13236 | 3/2000 |

OTHER PUBLICATIONS

G.Y. Chung, C.C. Tin, J.R. Williams, K. McDonald, R.A. Weller, S.T. Pantelides, L.C. Feldman, M.K. Das, and J.W. Palmour, "Improved Inversion Channel Mobility for 4H—SiC MOSETs Following High Temperature Anneals in Nitric Oxide," *IEE Electron Devices Letters* accepted for publication.

G.Y. Chung, C.C. Tin, J.R. Williams, K. McDonald, M. Di Ventra, S.T. Pantelides, L.C. Feldman, and R.A. Weller, "Effect of nitric oxide annealing on the interface trap densities near the band edges in 4H." *Applied Physics Letters*, vol. 76, No. 13, pp. 1713–1715, Mar. 2000.

P.T. Lai, Supratic Chakraborty, C.L. Chan, and Y.C. Cheng, "Effects of nitridation and annealing on interface properties of thermally oxidized $SiO_2$/SiC metal–oxide–semiconductor system," *Applied Physics Letters*, vol. 76, No. 25, pp. 3744–3746, Jun. 2000.

J.P. Xu, P.T. Lai, C.L. Chan, B. Li, and Y.C. Cheng, "Improved Performance and Reliability of $N_2O$–Grown Oxynitride on 6H—SiC," *IEEE Electron Device Letters*, vol. 21, No. 6, pp. 298–300, Jun. 2000.

L.A. Lipkin and J.W. Palmour, "Low interface state density oxides on p–type SiC," *Materials Science Forum* vols. 264–268, pp. 853–856, 1998.

A.K. Agarwal, J.B. Casady, L.B. Rowland, W.F. Valek, M.H. White, and C.D. Brandt, "1.1 kV 4H—SiC Power UMOSFET's," *IEEE Electron Device Letters*, vol. 18, No. 12, pp. 586–588, Dec. 1997.

A.K. Agarwal, J.B. Casady, L.B. Rowland, W.F. Valek, and C.D. Brandt, "1400 V 4H—SiC Power MOSFET's," *Materials Science Forum* vols. 264–268, pp. 989–992, 1998.

J. Tan, J.A. Cooper, Jr., and Mr.R. Melloch, "High–Voltage Accumulation–Layer UMOSFETs in 4H—SiC," *IEEE Electron Device Letters*, vol. 19, No. 12, pp. 487–489, Dec. 1998.

J.N. Shenoy, J.A. Cooper and M.R. Meelock, "High–Voltage Double–Implanted Power MOSFETs in 6H—SiC," *IEEE Electron Device Letters*, vol. 18, No. 3, pp. 93–95, Mar. 1997.

J.B. Casady, A.K. Agarwal, L.B. Rowland, W.F. Valek, and C.D. Brandt, "900 V DMOS and 1100 V UMOS 4H—SiC Power FETs," IEEE Device Research Conference, Ft. Collins, CO Jun. 23–25, 1997.

R. Schörner, P. Friedrichs, D. Peters, H. Mitlehner, B. Weis, and D. Stephani, "Rugged Power MOSFETs in 6H—SiC with Blocking Capability up to 1800 V," *Materials Science Forum* vols. 338–342, pp. 1295–1298, 2000.

V.R. Vathulya and M.H. White, "Characterization of Channel Mobility on Implanted SiC to Determine Polytype Suitability for the Power of DIMOS Structure," Electronic Materials Conference, Santa Barbara, CA, Jun. 30–Jul. 2, 1999.

A.V. Suvorov, L.A. Lipkin, G.M. Johnson, R. Singh, and J.W. Palmour, "4H—SiC Self–Aligned Implant–Diffused Structure for Power DMOSFETs," *Materials Science Forum* vols. 338–342, pp. 1275–1278, 2000.

R.Schorner, P. Friedrichs, D. Peters, and D. Stephani, "Significantly Improved Performance of MOSFETs on Silicon Carbide Using the 15R—SiC Polytype," *IEEE Electron Device Letters*, vol. 20, No. 5, pp. 241–244, May 1999.

S.T. Pantelides, "Atomic Scale Engineering of SiC Dielectric Interfaces," DARPA/MTO High Power and ONR Power Switching MURI Reviews, Rosslyn, VA, Aug. 10–12, 1999.

V.V. Afanas'ev, M. Bassler, G. Pensl, and M. Schulz, "Intrinsic $SiC/SiO_2$ Interface States," *Phy. Stat. Sol. (a)* vol. 162, pp. 321–337, 1997.

S. Sridevan, P.K. McLarty, and B.J. Baliga, "On the Presence of Aluminum in Thermally Grown Oxides on 6H–Silicon Carbide," *IEEE Electron Device Letters*, vol. 17, No. 3, pp. 136–138, Mar. 1996.

M.A. Capano, S.Ryu, J.A. Cooper, Jr., M.R. Melloch, K. Rottner, S. Karlsson, N. Nordell, A. Powell, and D.E. Walker, Jr., "Surface Roughening in Ion Implanted 4H–Silicon Carbide," *Journal of Electronic Materials*, vol. 28, No. 3, pp. 214–218, Mar. 1999.

M.K. Das, J.A. Cooper, Jr., M.R. Melloch, and M.A. Capano, "Inversion Channel Mobility in 4H— and 6H—SiC MOSFETs," IEEE Semiconductor Interface Specialists Conference, San Diego, CA, Dec. 3–5, 1998.

P.M. Shenoy and B.J. Baliga, "The Planar 6H—SiC ACCUFET: A New High–Voltage Power MOSFET Structure," *IEEE Electron Device Letters*, vol. 18, No. 12, pp. 589–591, Dec. 1997.

Ranbir Singh, Sei–Hyung Ryu and John W. Palmour, "High Temperature, High Current, 4H—SiC Accu–DMOSFET," *Materials Science Forum* vols. 338–342, pp. 1271–1274, 2000.

Y. Wang, C. Weitzel, and M. Bhatnagar, "Accumulation–Mode SiC Power MOSFET Design Issues," *Materials Science Forum*, vols. 338–342, pp. 1287–1290.

A.K. Agarwal, N.S. Saks, S.S. Mani, V.S. Hegde and P.A. Sanger, "Investigation of Lateral RESURF, 6H—SiC MOSFETs," *Materials Science Forum*, vols. 338–342, pp. 1307–1310, 2000.

S. Sridevan and B. Jayant Baliga, "Lateral N–Channel Inversion Mode 4H—SiC MOSFET's," *IEEE Electron Device Letters*, vol. 19, No. 7, pp. 228–230, Jul. 1998.

D. Alok, E. Arnold, and R. Egloff, "Process Dependence of Inversion Layer Mobility in 4H—SiC Devices," *Materials Science Forum*, vols. 338–342, pp. 1077–1080, 2000.

K. Ueno and Tadaaki Oikawa, "Counter–Doped MOSFET's of 4H—SiC." *IEEE Electron Devices Letters*, vol. 20, No. 12, pp. 624–626, Dec. 1999.

V.R. Vathulya, H. Shang, and M. H. White, "A Novel 6H–SiC Power DMOSFET with Implanted P–Well Spacer." *IEEE Electron Device Letters*, vol. 20, No. 7, Jul. 1999, pp. 354–356.

A.K. Agarwal, S. Seshadri, and L. B. Rowland, "Temperature Dependence of Fowler–Nordheim Current in 6H—and 4H—SiC MOS Capacitors." *IEEE Electron Device Letters*, vol. 18, No. 12, Dec. 1997, pp. 592–594.

P. J. Tobin, Y. Okada, S. A. Ajuria, V. Lakhotia, W. A. Feil, and R. I. Hedge, "Furnace formation of silicon oxynitride thin dielectrics in nitrous oxide ($N_2O$): The role of nitric oxide (NO)." *Journal of Applied Physics*. vol. 75, No. 3, Feb. 1, 1994, pp. 1811–1817.

Sze, S.M. *Physics of Semiconductor Devices*, John Wiley & Sons, p. 383–390.

H.F. Li, S. Dimitrijev, H.B. Harrison, D. Sweatman, and P.T. Tanner. "Improving $SiO_2$ Grown on P–Type 4H—SiC by NO Annealing." *Materials Science Forum*. vols. 264–268 (1998) pp. 869–872.

K. Ueno, R. Asai, and T. Tsuji. "4H—SiC MOSFET's Utilizing the $H_2$ Surface Cleaning Technique." *IEEE Electron Device Letters*, vol. 19, No. 7, Jul. 1998, pp. 244–246.

Chung et al. "The Effect of Si:C Source Ratio on $SiO_2$/SiC Interface State Density for Nitrogen Doped 4H and 6H—SiC," *Materials Science Forum*. (2000) vols. 338–342, pp. 1097–1100.

Pantelides et al. "Atomic–Scale Engineering of the SiC—$SiO_2$ Interface," *Materials Science Forum*. (2000) vols. 338–342, pp. 1133–1136.

Chakraborty et al. "Interface properties of $N_2O$–annealed $SiO_2$/SiC systems," *Proc. 2000 IEEE Electron Devices Meeting*. Hong Kong, China, Jun. 24, 2000, pp. 108–111.

Lipkin et al. "Challenges and State–of–the–Art Oxides in SiC," *Mat. Res. Soc. Symp. Proc.* vol. 640, Nov. 2000, pp. 27–29.

Jamet, et al. "Physical properties of $N_2O$ and NO–nitrided gate oxides grown on 4H SiC," *Applied Physics Letters*. vol. 79, No. 3, Jul. 16, 2001, pp. 323–325.

International Search Report, PCT/US 01/42414, Apr. 23, 2002, 10 pages.

Agarwal et al. "A Critical Look at the Performance Advantages and Limitations of 4H—SiC Power UMOSFET Structures," *1996 IEEE ISPSD and IC's Proc.*, May 20–23, 1996, pp. 119–122.

Lipkin et al. "Insulator Investigation on SiC for Improved Reliability," *IEEE Transactions on Electron Devices*. vol. 46, No. 3, Mar. 1999, pp. 525–532.

Agarwal et al. "Temperature Dependence of Fowler–Nordheim Current in 6H—and 4H—SiC MOS Capacitors," *IEEE Electron Device Letters*. vol. 18, No. 12, Dec. 1997, pp. 592–594.

Kobayashi et al. "Dielectric Breakdown and Current Conduction of Oxide/Nitride/Oxide Multi–Layer Structures," *1990 IEEE Symposium on VLSI Technology*, pp. 119–120.

Ma et al. "Fixed and trapped charges at oxide–nitride–oxide heterostructure interfaces formed by remote plasma enhanced chemical vapor deposition," *J. Vac. Sci. Technol B*. vol. 11, No. 4, Jul./Aug. 1993, pp. 1533–1540.

Das, Mrinal K. Graduate thesis entitled, *Fundamental Studies of the Silicon Carbide MOS Structure*. Purdue University.

Chakraborty et al. "Interface Properties of $N_2O$–annealed $SiO_2$/SiC system," *Proceedings IEEE Hong Kong Electron Devices Meeting*. Jun. 24, 2000, pp. 108–111.

Copy of International Search Report for PCT/US01/30715.

Lai et al. "Interface Properties of $N_2O$–Annealed $NH_3$–Treated 6H–SiC MOS Capacitor," *Proc. 1999 IEEE Hong Kong Electron Devices Meeting*, Jun. 26, 1999, pp. 46–49.

Williams et al., "Passivation of the 4–H SiC/$SiO_2$ Interface with Nitric Oxide", *Materials Science Forum*, vols. 389–393, 2002, pp. 967–972.

Chung et al., "Effects of Anneals in Ammonia on the Interface Trap Density Near the Band Edges in 4H–Silicon Carbide Metal–Oxide–Semiconductor Capacitors", *Applied Physics Letters*, vol. 77, No. 22, Nov. 27, 2000, pp. 3601–3603.

Dimitrijev et al., "Nitridation of Silicon–Dioxide Films Grown on 6H Silicon Carbide", *IEEE Electronic Device Letters*, vol. 18, No. 5, May 5, 1997, pp. 175–177.

De Mao et al., "Thermal Oxidation of SiC in $N_2O$", *J. Electrochem. Soc.*, vol. 141, 1994, pp. L150–L152.

Ryu et al., Article and Presentation: "27 m$\Omega$–cm$^2$, 1.6 kV Power DiMOSFETs in 4H–SiC," *Proceedings of the 14 International Symposium on Power Semiconductor Devices & ICs 2002*, Jun. 4–7, 2002, Santa Fe, NM.

Mutin, P. Herbert, "Control of the Composition and Structure of Silicon Oxycarbide and Oxynitride Glasses Derived from Polysiloxane Precursors," *Journal of Sol–Gel Science and Technology*, vol. 14, 1999, pp. 27–38.

del Prado et al. "Full Composition Range Silicon Oxynitride Films Deposited by ECR–PECVD at Room Temperatures," *Thin Solid Films*. vol. 343–344, 1999, pp. 437–440.

Wang et al. "High Temperature Characteristics of High–Quality SiC MIS Capacitors with O/N/O Gate Dielectric," *IEEE Transactions on Electron Devices*. vol. 47, No. 2, Feb. 2000, pp. 458–462.

International Search Report for PCT/US02/09393 dated Oct. 15, 2003.

Xu et al. "Improved Performance and Reliability of $N_2O$–Grown Oxynitride on 6H –SiH," *IEEE Electron Device Letters*. vol. 21, No. 6, Jun. 2000, pp. 298–300.

Lai et al. "Interface Properties of $N_2O$–Annealed $NH_3$–Treated 6H–SiC MOS Capacitor," *Electron Devices Meeting*, Jun. 26, 1999, pp. 46–49.

Lipkin et al. "Challenges and State–of–the–Art of Oxides on SiC," *Mat. Res. Symp. Proc.* vol. 640, 2001.

Cho et al. "Improvement of charge trapping by hydrogen post–oxidation annealing in gate oxide of 4H–SiC methel–oxide–semiconductor capacitors," *Applied Physics Letters*. vol. 77, No. 8, pp. 1215–1217.

Fukuda et al. "Improvement of $SiO_2$/4H–SiC Interface Using High–Temperature Hydrogen Annealing at Low Pressure and Vacuum Annealing," *Jpn J. Appl. Phys.* vol. 38, Apr. 1999, pp. 2306–2309.

Suzuki et al. "Effect of Post–oxidation–annealing in Hydrogen on $SiO_2$/4H–SiC Interface," *Materials Science Forum*, vols. 338–342 (2000) 1073–6.

Leonhard et al. "Long term stability of gate–oxides on n–and p–type silicon carbide studied by charge injection techniques," *Materials Science Engineering*, vol. 46, No. 1–3, Apr. 1997, pp. 263–266.

Fukuda et al. "Improvement of $SiO_2$/4H–SiC Interface by Using High Temperature Hydrogen Annealing at 1000° C," *Extended Abstracts of the International Conference on Solid State Devices and Materials*, Japan Society of Applied Physics, Tokyo, Japan, Sep. 1998.

Chang et al. "Observation of a Non–stoichiometric Layer at the Silicon Dioxide–Silicon Carbide Interface: Effect of Oxidation Temperature and Post–Oxidation Processing Conditions," *Mat. Res. Soc. Symp. Proc.* vol. 640, 2001.

* cited by examiner

METHOD OF N₂O GROWTH OF AN OXIDE LAYER ON A SILICON CARBIDE LAYER

RELATED APPLICATIONS

The present application claims priority from U.S. Provisional Application Serial No. 60/294,307 entitled "METHOD OF N20 GROWTH OF AN OXIDE LAYER ON A SILICON CARBIDE LAYER" filed May 30, 2001 and claims priority from, and is a continuation-in-part of, U.S. patent application Ser. No. 09/834,283 filed Apr. 12, 2001 entitled "METHOD OF N20 ANNEALING AN OXIDE LAYER ON A SILICON CARBIDE LAYER" which claims priority from U.S. Provisional Application Serial No. 60/237,822, entitled "Method of Improving an Interface Between a Silicon Carbide Layer and an Oxide Layer" and U.S. Provisional Application Serial No. 60/237,426 entitled "SiC Power MOSFET and Method of Fabrication" which were filed Oct. 3, 2000. The disclosures of each of the above-cited applications are incorporated herein by reference as if set forth fully herein.

FIELD OF THE INVENTION

The present invention relates to the fabrication of semiconductor devices and more particularly, to the fabrication of oxide layers on silicon carbide (SiC).

BACKGROUND OF THE INVENTION

Devices fabricated from silicon carbide are typically passivated with an oxide layer, such as $SiO_2$, to protect the exposed SiC surfaces of the device and/or for other reasons. However, the interface between SiC and $SiO_2$ may be insufficient to obtain a high surface mobility of electrons. More specifically, the interface between SiC and $SiO_2$ conventionally exhibits a high density of interface states, which may reduce surface electron mobility.

Recently, annealing of a thermal oxide in a nitric oxide (NO) ambient has shown promise in a planar 4H—SiC MOSFET structure not requiring a p-well implant. See M. K. Das, L. A. Lipkin, J. W. Palmour, G. Y. Chung, J. R. Williams, K. McDonald, and L. C. Feldman, "High Mobility 4H—SiC Inversion Mode MOSFETs Using Thermally Grown, NO Annealed $SiO_2$," IEEE Device Research Conference, Denver, Colo., Jun. 19–21, 2000 and G. Y. Chung, C. C. Tin, J. R. Williams, K.

McDonald, R. A. Weller, S. T. Pantelides, L. C. Feldman, M. K. Das, and J. W. Palmour, "Improved Inversion Channel Mobility for 4H—SiC MOSFETs Following High Temperature Anneals in Nitric Oxide," IEEE Electron Device Letters accepted for publication, the disclosures of which are incorporated by reference as if set forth fully herein. This anneal is shown to significantly reduce the interface state density near the conduction band edge. G. Y. Chung, C. C. Tin, J. R. Williams, K. McDonald, M. Di Ventra, S. T. Pantelides, L. C. Feldman, and R. A. Weller, "Effect of nitric oxide annealing on the interface trap densities near the band edges in the 4H polytype of silicon carbide," Applied Physics Letters, Vol. 76, No. 13, pp. 1713–1715, March 2000, the disclosure of which is incorporated herein as if set forth fully. High electron mobility (35–95 $cm^2/Vs$) is obtained in the surface inversion layer due to the improved MOS interface.

Unfortunately, NO is a health hazard having a National Fire Protection Association (NFPA) health danger rating of 3, and the equipment in which post-oxidation anneals are typically performed is open to the atmosphere of the cleanroom. They are often exhausted, but the danger of exceeding a safe level of NO contamination in the room is not negligible.

Growing the oxide in $N_2O$ is possible as described in J. P. Xu, P. T. Lai, C. L. Chan, B. Li, and Y. C. Cheng, "Improved Performance and Reliability of $N_2O$ -Grown Oxynitride on 6H—SiC," IEEE Electron Device Letters, Vol. 21, No. 6, pp. 298–300, June 2000, the disclosure of which is incorporated by reference as if set forth fully herein. Xu et al. describe oxidizing SiC at 1100° C. for 360 minutes in a pure $N_2O$ ambient and annealing in $N_2$ for 1 hour at 1100° C.

Post-growth nitridation of the oxide on 6H—SiC in $N_2O$ at a temperature of 1100° C. has also been investigated by Lai et al. P. T. Lai, Supratic Chakraborty, C. L. Chan, and Y. C. Cheng, "Effects of nitridation and annealing on interface properties of thermally oxidized $SiO_2$/SiC metal-oxide-semiconductor system," Applied Physics Letters, Vol. 76, No. 25, pp. 3744–3746, June 2000, the disclosure of which is incorporated by reference as if set forth fully herein. However, Lai et al. concluded that such treatment deteriorates the interface quality which may be improved with a subsequent wet or dry anneal in $O_2$ which may repair the damage induced by nitridation in $N_2O$. Moreover, even with a subsequent $O_2$ anneal, Lai et al. did not see any significant reduction in interface state density as compared to the case without nitridation in $N_2O$.

SUMMARY OF THE INVENTION

Embodiments of the present invention provide methods for fabricating a layer of oxide on a silicon carbide layer by forming the oxide layer on the silicon carbide layer by oxidizing the silicon carbide layer in an $N_2O$ environment. Preferably, a predetermined temperature profile and/or a predetermined flow rate profile of $N_2O$ are provided during the oxidation. The predetermined temperature profile and/or predetermined flow rate profile may be constant or variable and may include ramps to steady state conditions. The predetermined temperature profile and/or the predetermined flow rate profile are selected so as to reduce interface states of the oxide/silicon carbide interface with energies near the conduction band of SiC.

In particular embodiments of the present invention, the predetermined temperature profile may result in an oxidation temperature of at least about 1200° C. In particular embodiments, the oxidation temperature is about 1300° C. In further embodiments of the present invention, the duration of the oxidation may vary depending on the thickness of the oxide layer desired. Thus, oxidation may be carried out for from about 15 minutes to about 3 hours or longer.

In additional oxidation embodiments of the present invention, the predetermined flow rate profile includes one or more flow rates of from about 2 Standard Liters per Minute (SLM) to about 6 SLM. In particular embodiments, the flow rates are from about 3.5 to about 4 Standard Liters per Minute.

In further embodiments, formation of the oxide layer may be followed by annealing the oxide layer in inert gas such as Ar or $N_2$ or combinations thereof. The post formation anneal may also be carried out in a hydrogen containing environment, such as $H_2$ or combinations of $H_2$ and one or more inert gases such as Ar or $N_2$. Such an annealing operation may be carried out, for example, for about one hour.

In still further oxidation embodiments of the present invention, the predetermined flow rate profile provides a velocity or velocities of the $N_2O$ of from about 0.37 cm/s to about 1.11 cm/s. In particular embodiments, the predetermined flow rate profile provides a velocity or velocities of the $N_2O$ of from about 0.65 cm/s to about 0.74 cm/s.

In additional oxidation embodiments, methods for fabricating a layer of oxide on a silicon carbide layer include forming the oxide layer on the silicon carbide layer in an $N_2O$ environment at a predetermined temperature profile which includes an oxidation temperature of at least about 1200° C. and at a predetermined flow rate profile for the $N_2O$. The predetermined flow rate profile may be selected to provide an initial residence time of the $N_2O$ of at least about 11 seconds.

In particular oxidation embodiments of the present invention, the initial residence time may be from about 11 seconds to about 33 seconds. In still further embodiments of the present invention, the initial residence time is from about 19 seconds to about 22 seconds.

Additionally, a total residence time of the $N_2O$ may be from about 28 seconds to about 84 seconds. In such oxidation embodiments of the present invention, the total residence time may also be from about 48 seconds to about 56 seconds.

DETAILED DESCRIPTION OF THE INVENTION

Figure 1:
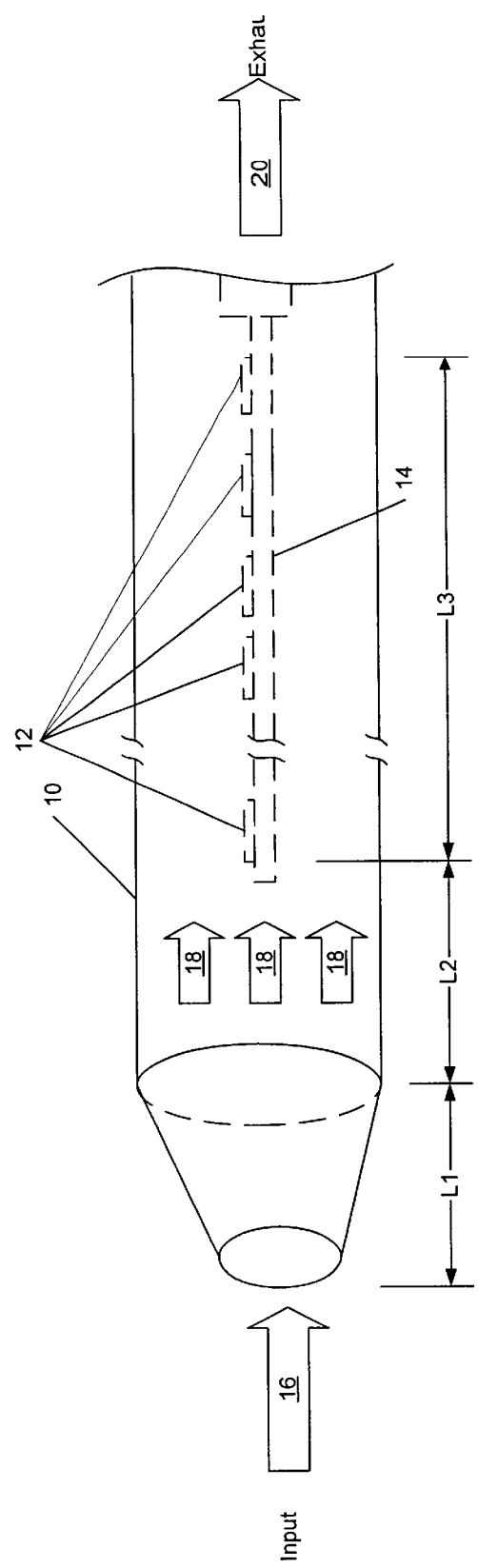
FIG. 1 is a schematic illustration of a furnace tube suitable for use in embodiments of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Embodiments of the present invention provide methods which may improve the interface between an oxide layer and SiC in any device which includes such an interface. These methods are especially advantageous in the fabrication of Metal-Oxide-Semiconductor (MOS) devices created on SiC. Using embodiments of the present invention, interface states with energy levels near the conduction band of SiC may be dramatically reduced. Reduction of such defects may be advantageous, because these defects may limit a MOSFET's effective surface channel mobility.

Embodiments of the present invention will now be described with reference to FIGS. 1, 2A and 2B which are a schematic illustration of a furnace tube suitable for use in embodiments of the present invention and flow charts illustrating operations according to particular embodiments of the present invention. As seen in FIG. 1, the furnace tube 10 has a plurality of wafers 12 of SiC either with an oxide layer, such as $SiO_2$, formed thereon or on which an oxide layer is to be formed. Preferably, the SiC wafer is 4H—SiC. The wafers 12 are placed on a carrier 14 such that the wafers will, typically have a fixed position in the furnace tube 10. The carrier 14 is positioned so that the wafers are a distance L1+L2 from an inlet of the furnace tube 10 and extend for a distance L3 within the furnace tube 10. Input gases 16, include $N_2O$ which provides an $N_2O$ environment as described herein, are passed into the furnace tube 10 and are heated as they traverse the distance L1 based on a predetermined temperature profile so as to provide the heated gases 18. The heated gases 18 are maintained at temperatures based on the predetermined temperature profile and traverse the distance L2 to reach the first of the wafers 12. The heated gases 18 continue to pass through the furnace tube 10 until they leave the furnace tube 10 through an outlet port as exhaust gases 20. Thus, the heated gases 18 traverse the distance L3. The heated gases 18 are preferably maintained at a substantially constant temperature for the distances L2 and L3, however, as will be appreciated by those of skill in the art in light of the present disclosure, various temperature profiles may also be utilized. Such profiles may include variations in temperature over time or distance. However, the predetermined temperature profile should include either an anneal temperature of greater than about 1100° C. or an oxidation temperature of at least about 1200° C.

As is seen in FIG. 1, the heated gases 18 may reach a temperature at which the $N_2O$ begins to break down into its constituents at the end of the L1 distance. This distance may depend on the physical characteristics of the furnace tube 10, the predetermined temperature profile and the flow rate profile. After reaching the temperature at which the $N_2O$ begins to break down, the heated gases 18 traverse the distance L2 before reaching the wafers 12. The amount of time that it takes the heated gases to traverse the distance L2 is referred to herein as an "initial residence time." Preferably, the heated gasses are maintained at a substantially constant temperature corresponding to an anneal temperature of greater than about 1100° C. or an oxidation temperature of at least about 1200° C. for the initial residence time. However, as will be appreciated by those of skill in the art, differing heating profiles could be utilized which increase or decrease the initial residence time. It is preferred, however, that the heating profile be rapid such that the initial residence time is substantially the same as the time that the heated gases 18 are maintained at an anneal temperature of greater than about 1100° C. or an oxidation temperature of at least about 1200° C. before traversing the L3 distance.

The total amount of time that it takes the heated gases 18 to traverse the distance L2+L3 is referred to herein as the "total residence time." As will be appreciated by those of skill in the art in light of the present disclosure, these residence times depend on the velocity of the heated gases 18 through the furnace tube 10 which may be determined based on the flow rates of the heated gases 18 and the cross-sectional area of the furnace tube 10. Such velocities may be average velocities, for example, if turbulent flow is achieved, or may be actual velocities, for example, in laminar flow systems. Thus, the term velocity is used herein to refer to both average and actual velocities.

Figure 2A:
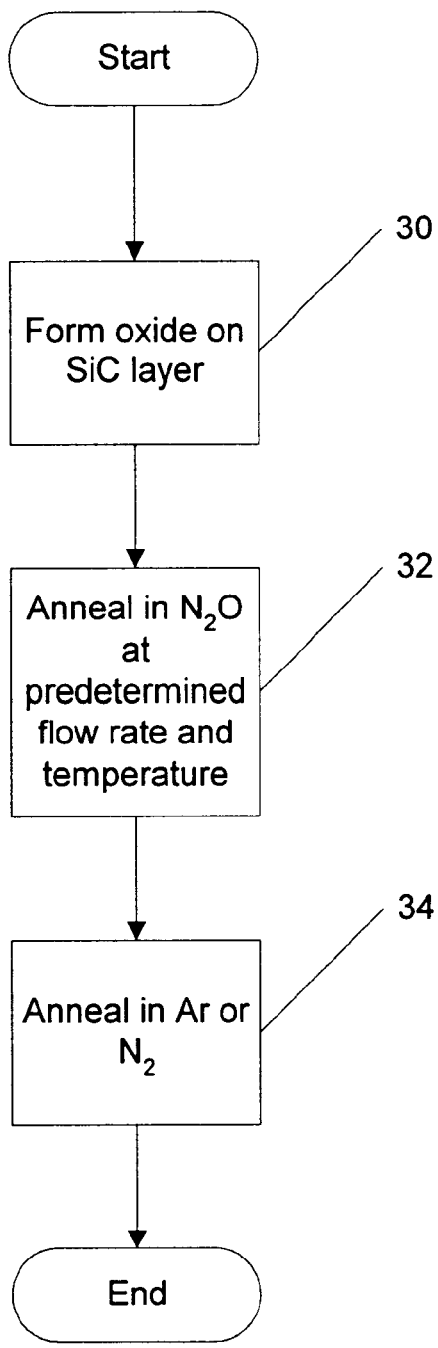
FIG. 2A is a flowchart illustrating processing steps according to anneal embodiments of the present invention.

FIG. 2A illustrates operations according to embodiments of the present invention and will be described with reference to FIG. 1. However, as will be appreciated by those of skill in the art in light of the present disclosure, embodiments of the present invention are not limited to the furnace tube embodiment illustrated in FIG. 1 but may be carried out in any system capable of providing the conditions described herein. Turning to FIG. 2A, operations may begin by forming an oxide layer on SiC layer (block 30). The SiC layer may be an epitaxial layer and/or a substrate. Furthermore, the oxide layer may be formed by deposition, such as Low Pressure Chemical Vapor Deposition (LPCVD), thermally grown through a thermal oxidation process and/or formed using other techniques. Preferably, the oxide layer is formed utilizing a wet reoxidation process as described in U.S. Pat. No. 5,972,801, the disclosure of which is incorporated herein by reference as if set forth fully herein. Furthermore, the oxide layer may be formed in situ with the subsequent $N_2O$ anneal and in situ with the SiC layer and/or it may be formed in a separate chamber.

The oxide layer is then annealed in an $N_2O$ environment at a predetermined temperature and a predetermined flow rate (block 32). Preferably, the oxide is annealed using a predetermined temperature profile which includes an anneal temperature of greater than about 1100° C. in a chamber in which $N_2O$ is supplied at a flow rate profile within predetermined flow rate limits. In further embodiments, the temperature of the anneal is about 1175° C. or higher. In particular embodiments, an anneal temperature of about 1200° C. may be utilized. The flow rate limits of $N_2O$ may be selected based on the particular equipment in which the process is used. However, in particular embodiments the flow rate limits of $N_2O$ may be as low as about 2 Standard Liters per Minute (SLM) or as high as about 8 SLM. In further embodiments, flow rate limits of from about 3 to about 5 SLM may be preferred.

For a 6 inch diameter furnace tube, flow rates of from 2 SLM to 8 SLM result in gas velocities as low as about 0.37 cm/sec or as high as about 1.46 cm/sec or, and flow rates of from 3 to 5 SLM result in velocities of from about 0.55 cm/s to about 0.95 cm/s. In particular, for an L2 distance of about 12 inches (about 30.48 cm) and an L3 distance of about 18 inches (about 45.72 cm), such velocities result in an initial residence time of from about 11 seconds to about 45 seconds and a total residence of from about 28 seconds to about 112 seconds. In particular preferred embodiments, the initial residence time is from about 16 seconds to about 31 seconds and a total residence time of from about 41 to about 73 seconds. The $N_2O$ anneal may be carried out for about 3 hours, however, anneals of from about 30 minutes to about 6 hours may also be utilized although longer times may also be utilized.

As is further illustrated in FIG. 2A, the $N_2O$ anneal may be followed by an optional anneal (block 34) in inert gas or gases, such as argon and/or $N_2$ or combinations thereof. The optional anneal may also be carried out in a hydrogen containing environment, such as $H_2$ or $H_2$ in combination with one or more inert gases, such as such as argon and/or $N_2$ or combinations thereof. Such an anneal may be carried out for about 1 hour, however, anneals of up to about 3 hours or longer may also be utilized.

Figure 2B:
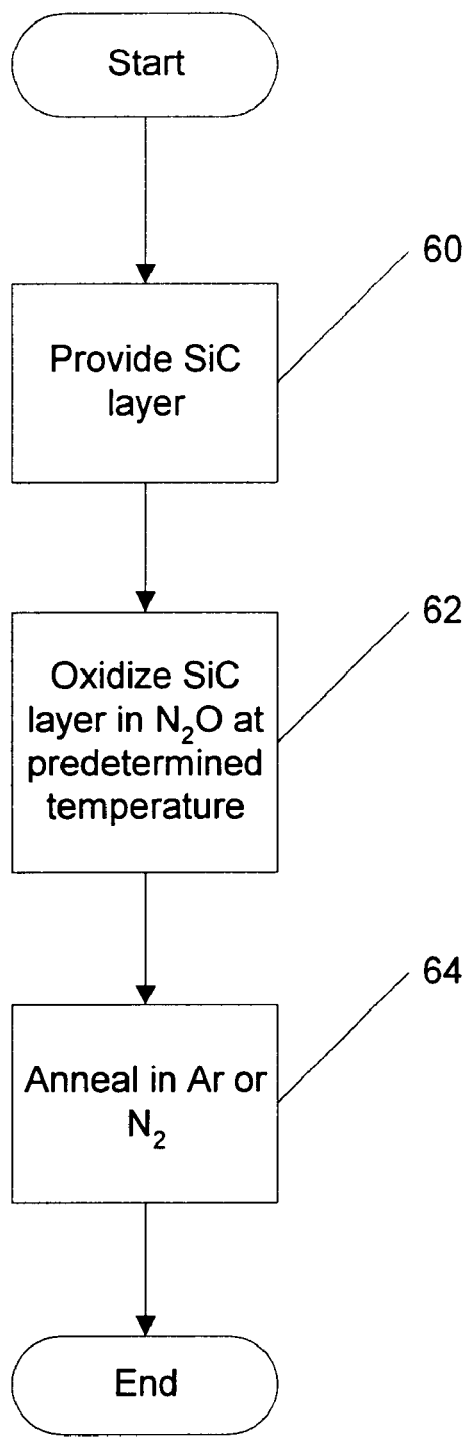
FIG. 2B is a flowchart illustrating processing steps according to oxidation embodiments of the present invention.

FIG. 2B illustrates operations according to further embodiments of the present invention and will be described with reference to FIG. 1. However, as will be appreciated by those of skill in the art in light of the present disclosure, embodiments of the present invention are not limited to the furnace tube embodiment illustrated in FIG. 1 but may be carried out in any system capable of providing the conditions described herein. Turning to FIG. 2B, operations begin by providing a SiC layer (block 60). The SiC layer may be an epitaxial layer and/or a substrate. The oxide layer is then formed in an $N_2O$ environment at a predetermined temperature and/or a predetermined flow rate (block 62).

The oxide layer is formed by oxidizing the SiC wafers 12 using a predetermined temperature profile which includes an oxidation temperature of greater than about 1200° C. in a chamber in which $N_2O$ is supplied at a flow rate profile within predetermined flow rate limits. In further embodiments, the temperature of the oxidation is about 1300° C. The flow rate limits of $N_2O$ may be selected based on the particular equipment in which the process is used. However, in particular embodiments, the flow rate limits of $N_2O$ may be as low as about 2 Standard Liters per Minute (SLM) or as high as about 6 SLM or higher. In further embodiments, flow rate limits of from about 3.5 SLM to about 4 SLM may be preferred. As used herein, $N_2O$ refers to pure $N_2O$ or $N_2O$ in combination with other oxidizing agents, such as steam, $O_2$, and/or inert gases.

For a 6 inch diameter furnace tube, flow rates of from about 2 SLM to about 6 SLM result in gas velocities as low as about 0.37 cm/sec or as high as about 1.11 cm/sec. Similarly, for a 6 inch diameter furnace tube, flow rates of from 3.5 SLM to 4 SLM result in velocities of from about 0.65 cm/s to about 0.74 cm/s. In particular, for an L2 distance of about 12 inches (about 30.48 cm) and an L3 distance of about 18 inches (about 45.72 cm), such velocities result in an initial residence time of from about 11 seconds to about 33 seconds and a total residence time of from about 28 seconds to about 84 seconds. In particular preferred embodiments, the initial residence time is from about 19 second to about 22 seconds and the total residence time is from about 49 to about 56 seconds. The $N_2O$ oxidation may be carried out for an amount of time dependent on the desired thickness of the oxide layer. For example, oxidation times of about 3 hours or greater may be utilized.

As is further illustrated in FIG. 2B, the $N_2O$ oxidation may be followed by an optional anneal (block 34') in an inert gas, such as argon or $N_2$. Optionally, the anneal may be carried out in a hydrogen containing environment, such as $H_2$ or $H_2$ in combination with one or more inert gases, such as argon and/or $N_2$ or combinations thereof. Such an anneal may be carried out for about up to 1 hour, however, anneals of up to about 3 hours or longer may also be utilized.

As seen in FIGS. 3 through 14, it has been found that, by appropriately controlling the anneal and/or oxidation temperature and $N_2O$ flow rate in accordance with the present invention, the $SiC/SiO_2$ interface quality may be improved, rather than damaged as taught by Lai et al.

While not wishing to be bound by any theory of operation, it appears that at high temperatures (above 800° C.), a fraction of $N_2O$ will break down into $N_2$, $O_2$ and NO. The fraction of NO is determined by the temperature and the amount of time the gas remains at elevated temperatures, which is determined by the flow rate of the gas, the cross-sectional area of the furnace tube and the distances in the tube. Table 1 shows the effect of the flow rate of $N_2O$ on the maximum interface state density for an anneal of 3 hours at 1175° C., followed by a 1 hour Ar anneal after the $N_2O$ anneal.

TABLE 1

Effect of Flow Rate on $N_2O$ Anneal.

| Flow Rate | Maximum Interface State Density ($10^{12}$ cm$^{-2}$eV$^{-1}$) |
|---|---|
| no anneal | 2.7 |
| 8 SLM (1.46 cm/s) | 1.5 |
| 6 SLM (1.10 cm/s) | 0.7 |
| 4 SLM (0.73 cm/s) | 0.6 |
| 2 SLM (0.37 cm/s) | 1.0 |

As shown in Table 1, the anneal with 4 SLM of $N_2O$ has the lowest interface state densities, and the most negative flat-band voltage. Accordingly, in particular embodiments of the present invention flow rates of from about 4 to about 6 SLM may be utilized.

FIGS. 3 through 10 illustrate the profile of interface trap density (Dit) throughout the bandgap at the $SiC/SiO_2$ interface for various embodiments of the present invention. $D_{IT}$ may be measured using any technique known to those of skill in the art.

Figure 3:
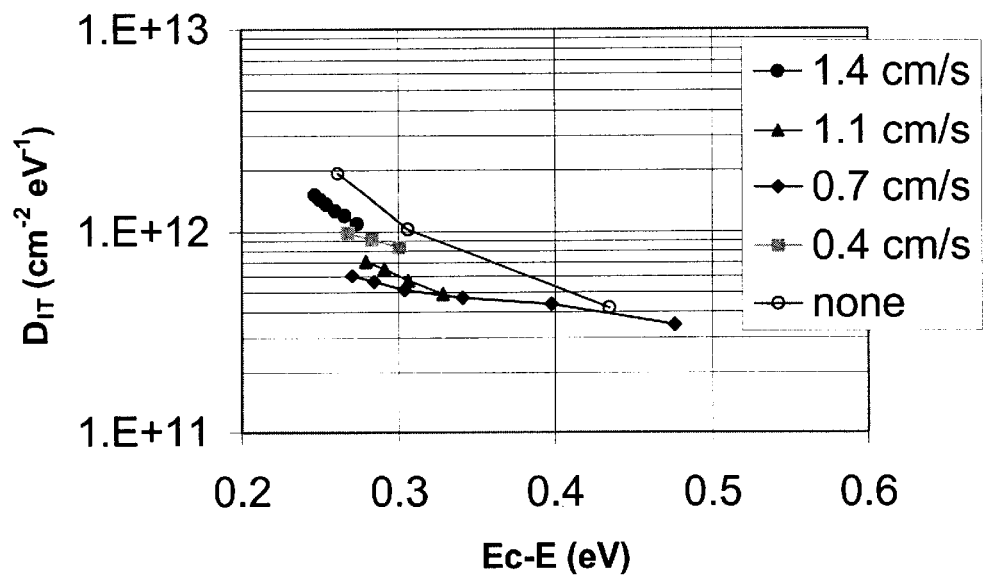
FIG. 3 is a graph illustrating the interface trap density versus energy level from the conduction band ($E_c$-E) for various flow rates of $N_2O$ at 1175° C.

FIG. 3 illustrates the interface trap density versus energy level for various velocities of $N_2O$ for the flow rates in Table 1 with an anneal temperature of 1175° C. As seen in FIG. 3, while each of the flow rates results in a reduced trap density as compared to no $N_2O$ anneal, the greatest reduction in trap density is provided by flow rates yielding velocities of 0.7 cm/s and 1.1 cm/s. FIG. 3 illustrates that the optimal flow rate is approximately 0.7 cm/s (or approximately 4 SLM).

Figure 4:
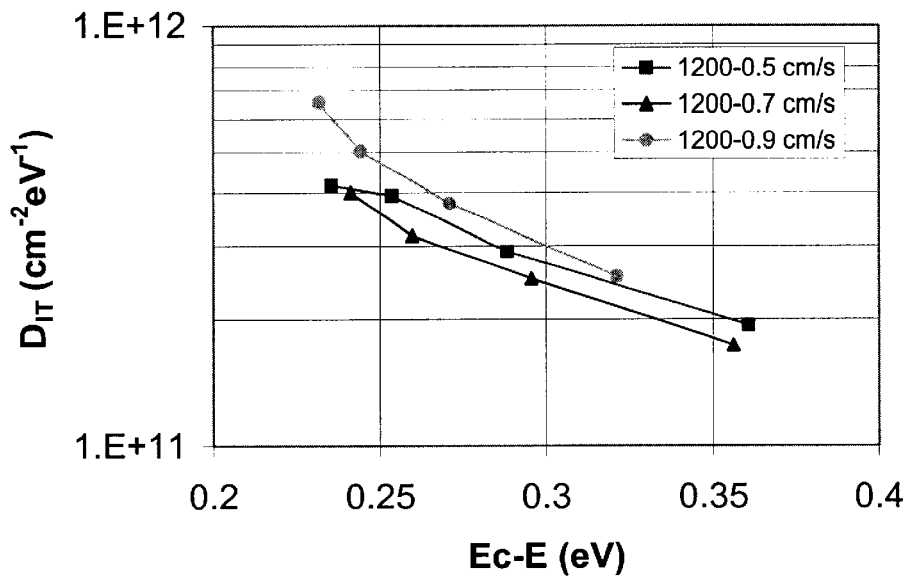
FIG. 4 is a graph of interface trap density ($D_{IT}$) versus energy level from the conduction band for various flow rates at 1200° C.

FIG. 4 is a graph of $D_{IT}$ versus energy level for various velocities with an anneal temperature of 1200° C. FIG. 4 likewise indicates that for a 1200° C. anneal, the greatest reduction in trap density is achieved with a velocity of approximately 0.7 cm/s (or approximately 4 SLM). Thus, from FIGS. 3 and 4, initial residence times of about 22 seconds may provide the greatest reduction in trap density.

Figure 5:
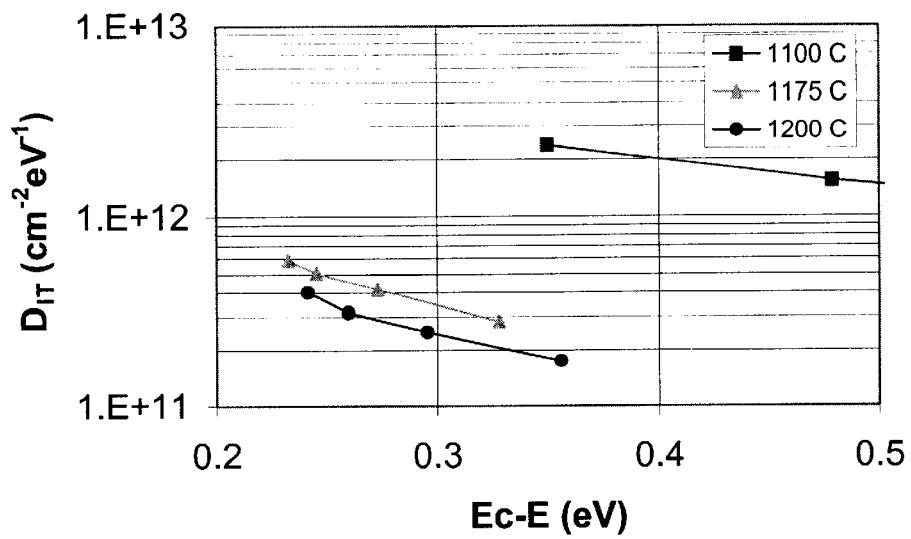
FIG. 5 is a graph of $D_{IT}$ versus energy level from the conduction band for various anneal temperatures.

FIG. 5 is a graph of $D_{IT}$ versus energy level for various anneal temperatures. FIG. 5 illustrates that the temperature should be above 1100° C. to obtain a reduction in Dit, and preferably above 1175° C.

Figure 6:
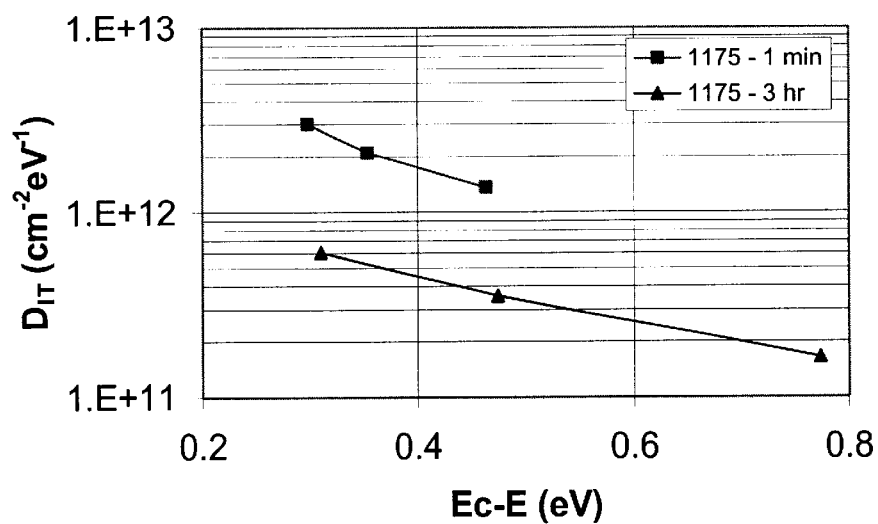
FIG. 6 is a graph of $D_{IT}$ versus energy level from the conduction band at 1175° C. for anneals of various different durations.

FIG. 6 is a graph of $D_{IT}$ versus energy level at 1175° C. for anneals of different durations, namely one minute and three hours. As seen in FIG. 6 a reduction in trap density is achieved by a longer duration anneal (3 hours) over a short duration anneal (1 minute).

Figure 7:
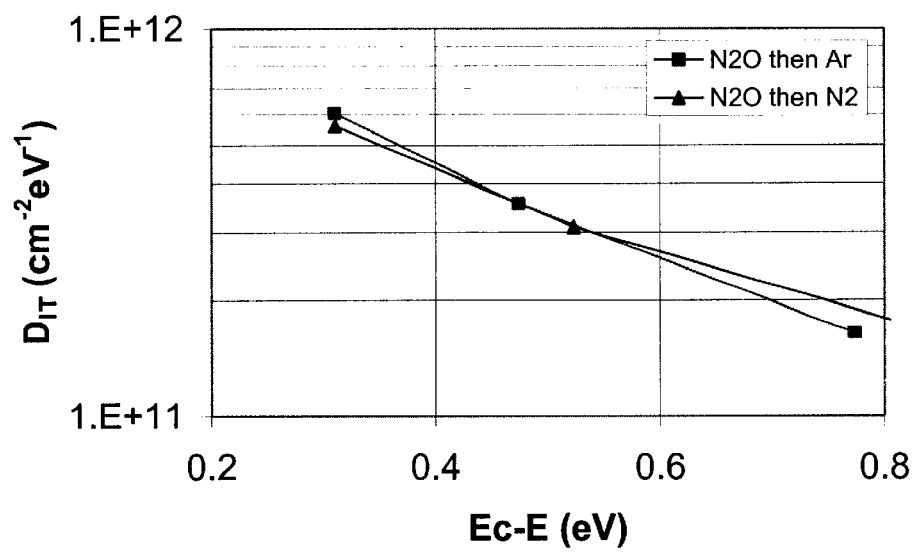
FIG. 7 is a graph of $D_{IT}$ versus energy level from the conduction band for a post-treatment anneal in Ar and $N_2$.

FIG. 7 is a graph of $D_{IT}$ versus energy level for a post-treatment anneal in Ar and $N_2$. FIG. 7 indicates that both atmospheres are suitable for purposes of the present invention, since they produce substantially similar results.

Figure 8:
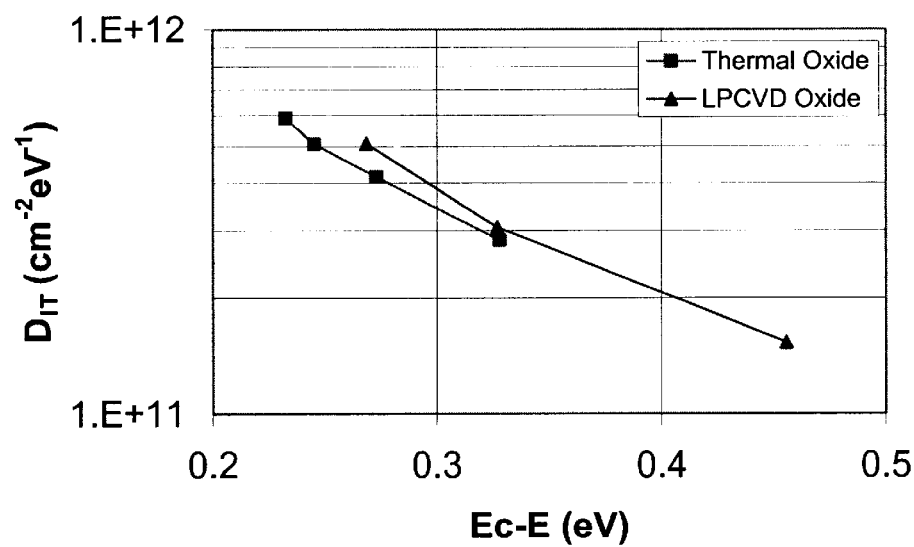
FIG. 8 is a graph of $D_{IT}$ versus energy level from the conduction band for an initial thermal oxide and an initial LPCVD oxide.

FIG. 8 is a graph of $D_{IT}$ versus energy level for two different types of oxides, a thermal oxide and an LPCVD oxide. FIG. 8 illustrates that trap densities may be reduced utilizing embodiments of the present invention for both types of oxides as similar results are achieved for both types of oxide.

Figure 9:
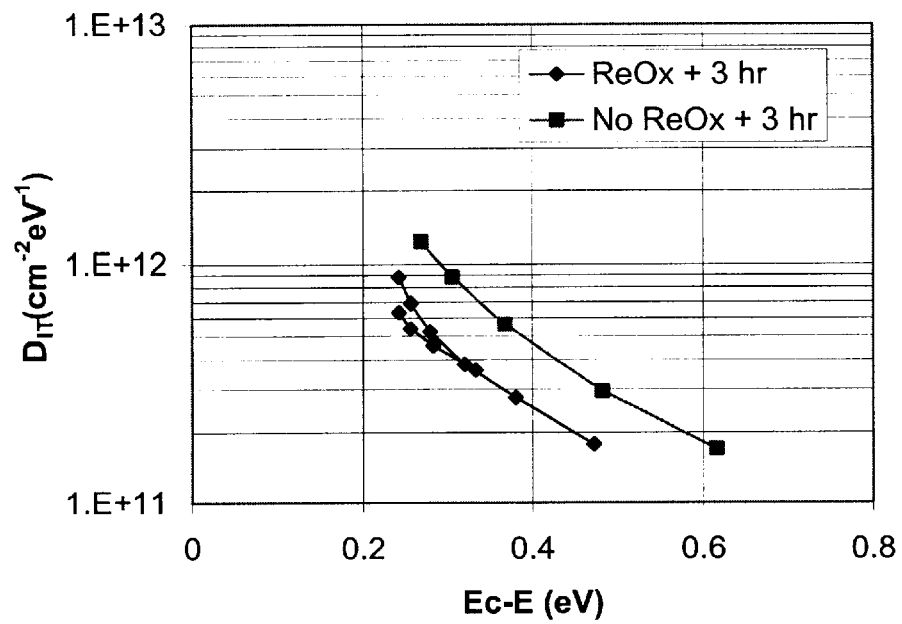
FIG. 9 is a graph of $D_{IT}$ versus energy level from the conduction band for oxide layers formed with and without a wet reoxidation.

FIG. 9 is a graph of $D_{IT}$ versus energy level for anneal times of 3 hours where the oxide layer included a wet reoxidation as described in U.S. Pat. No. 5,972,801, and for an anneal which did not utilize a wet reoxidation process. As can be seen from FIG. 9, decreased interface densities were achieved when a wet re-oxidation process was utilized.

Figure 10:
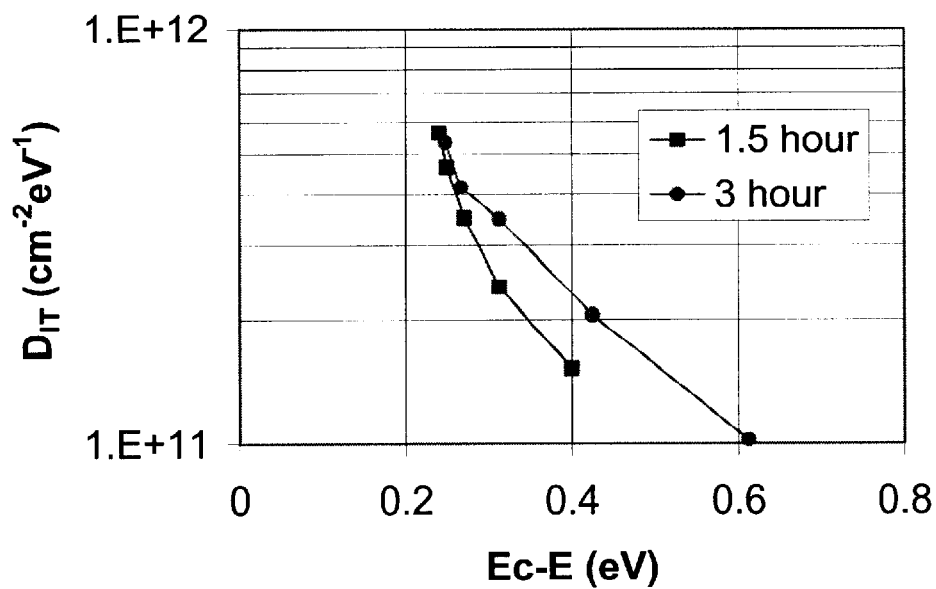
FIG. 10 is a graph of $D_{IT}$ versus energy level from the conduction band at 1175° C. for anneals of various different durations.

FIG. 10 is a graph of $D_{IT}$ versus energy level for durations of 1.5 and 3 hours. As can be seen from FIG. 10, it appears that durations as long as 3 hours may be no more effective, and possible less effective, than durations of about 1.5 hours. However, either duration appears to provide acceptable results.

Figure 11:
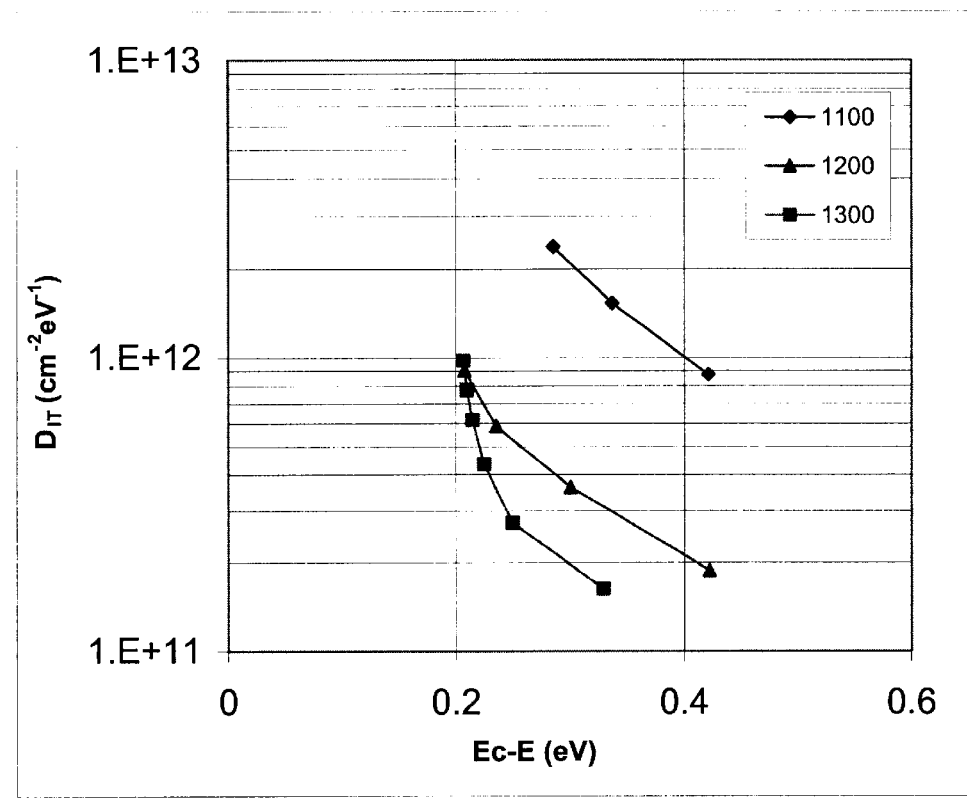
FIG. 11 is a graph illustrating the interface trap density (Dit) versus energy level from the conduction band ($E_c$-E) for various anneal temperatures.
Figure 12:
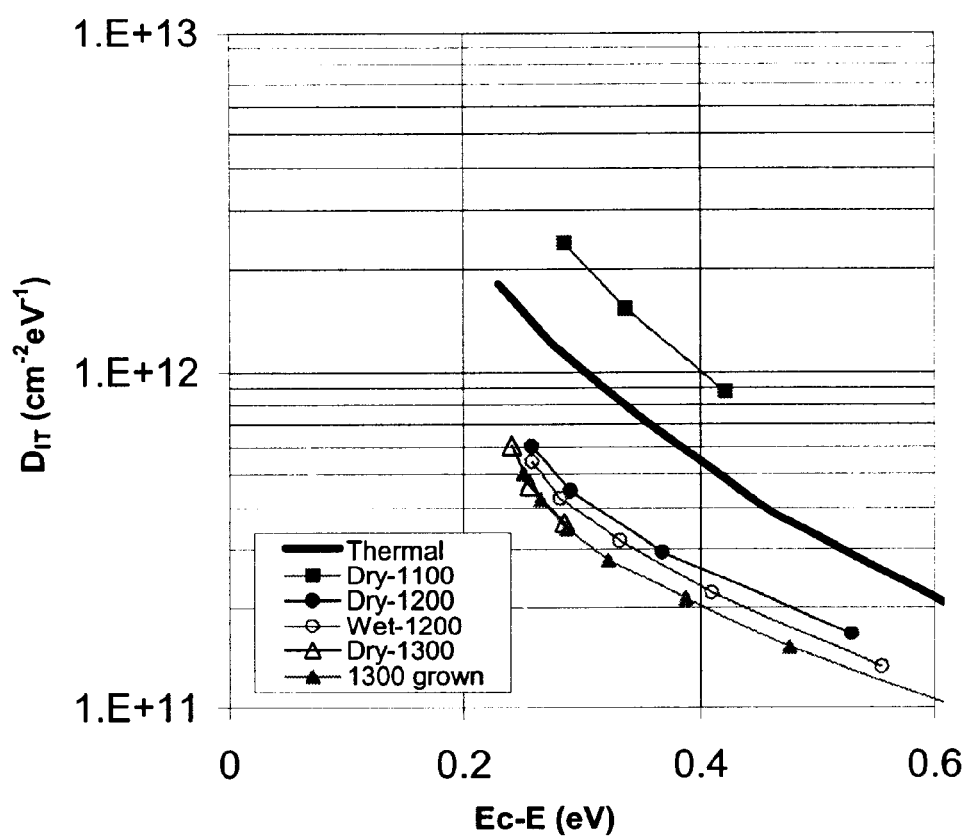
FIG. 12 is a graph of $D_{IT}$ versus energy level from the conduction band for various thermal oxidation, post-growth $N_2O$ anneals and $N_2O$ oxidation.

As illustrated in FIG. 11, annealing in an $N_2O$ environment at higher temperatures results in better interface characteristics over lower temperature anneals, as it appears that the chemistry yields more of the desired NO, by breaking down the $N_2O$ during the process. This is seen in FIG. 11, where $N_2O$ processing at 1100° C., 1200° C. and 1300° C. are compared. Furthermore, at higher temperatures, the oxidation rate increases significantly. At these higher rates, growing the oxide (as opposed to annealing an existing oxide) in the $N_2O$ ambient would be expected to be feasible. Oxides grown in $N_2O$ at 1300° C. have interface characteristics as good or better than $SiO_2/SiC$ interface characteristics reported to date and may significantly reduce the processing time required to separately grow the oxide and anneal it. As seen in FIG. 12, the "1300 grown" line illustrates the interface characteristics for an $N_2O$ oxidation process. Such an $N_2O$ oxidation may save several hours of processing time by eliminating the need for both growth and anneal steps.

As described above, SiC devices having an oxide-SiC interface, such as SiC Metal Oxide Semiconductor (MOS) devices may be severely impacted by the large density of interface states present at the $SiC/SiO_2$ interface. Interface states near the conduction band-edge may be particularly effective at inhibiting SiC device performance. Early improvements in oxidation processes typically reduced interface states only from the valence band to mid-gap. More recent progress has been accomplished using an NO anneal, which may lower the interface state densities near the conduction band-edge. While these improvements using NO annealing may be important, use of this gas in traditional furnaces may not be desirable with the health risks associated with pure NO. As described herein, the use of $N_2O$ has been pursued and effectively developed as an alternative to NO.

Figure 13:
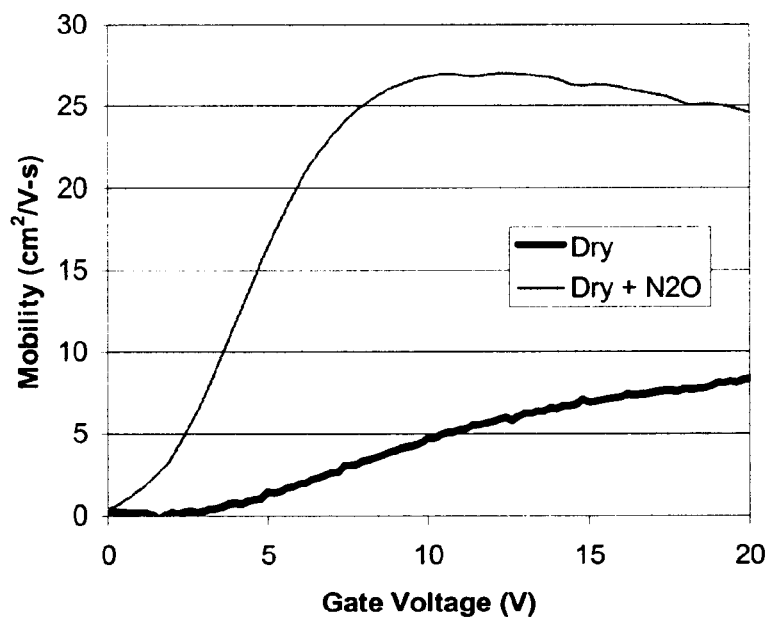
FIG. 13 is a graph of effective surface channel mobility versus gate voltage for 4H—SiC planar MOSFETs with and without $N_2O$ processing.

As shown in FIG. 13, the temperature of the $N_2O$ processing may be important. At lower temperatures (1100° C.), exposing an existing oxide to $N_2O$ increases the interface state density, as shown by comparing the heavy solid line representing a thermal oxide to the data for the same thermal oxide exposed to an 1100° C. $N_2O$ anneal. At 1200° C., the thermal oxide is significantly improved with the $N_2O$ anneal. Thermal oxides processed in a wet ambient may be further improved by the 1200° C. $N_2O$ anneal, as seen by comparing the solid circle to the open circle data. Further improved results were obtained using a 1300° C. $N_2O$ process. At this temperature, the oxidation of SiC is significant. So, in addition to annealing existing oxides in $N_2O$, some oxides were grown in the $N_2O$ ambient (500 Å was grown in 3 hours). Growing the oxide in $N_2O$ may save about 9 hours of processing time over annealing an existing oxide in $N_2O$, by eliminating the oxidation step. Substantially the same results were obtained regardless of whether the oxide was grown prior to $N_2O$ processing or grown in $N_2O$.

Figure 14:
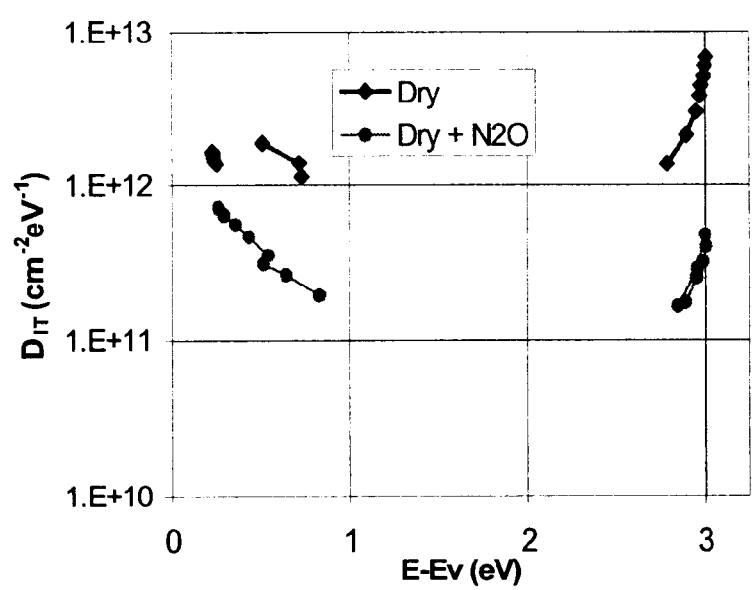
FIG. 14 is a graph of interface states for the oxides of FIG. 13.

MOSFETs processed with a 1200° C. $N_2O$ annealed oxide had higher effective surface channel mobility than devices that did not receive the $N_2O$ anneal, as shown in FIG. 13. The interface state densities measured on nearby p-type capacitor structures and corresponding n-type capacitors are shown in FIG. 14. The reduction in interface state density appears to directly correlate with an improvement in effective surface channel mobility.

In further examples of embodiments of the present invention, two n-type 4H wafers and two p-type 4H wafers were obtained. These four wafers were further divided, such that one wafer from each pair received an implant layer, and epitaxial re-growth to simulate a horizontal channel buffered gate FET (HCBGFET) device while MOSFETs were fabricated on the other wafers. The horizontal channel buffered gate FET devices were fabricated on the selected wafers by a blanket Al implant and an implant anneal. An additional n-type epi layer was grown on this implanted layer. The Source/Drain regions were implanted and annealed. These wafers were isolated by etching the n-type epi layer in non-device regions. A field oxide was deposited and densified. Active device areas were opened in the field oxide. The gate insulator was grown in $N_2O$ at 1300° C. The gate metal was deposited and patterned. Source/Drain contacts were deposited. Backside Pt was deposited. The contacts were annealed to make them ohmic.

Effective surface channel mobilities and threshold voltages were measured for the MOSFETs. Additionally, "fatFET" devices, which had a gate length of 200 μm and width of 200 μm, were utilized for these measurements as the device characteristics will be dominated by the channel resistance. Table 2 summarizes this fatFET data.

TABLE 2

Parameters for MOSFETs with gate oxides thermally grown in $N_2O$.

| Wafer | Description | Yield | $V_T$ (V) | Mobility ($cm^2$/v-s) |
|---|---|---|---|---|
| #1 | MOSFET | 80% | 5.6 | 17.8 (20.0) |
| #2 | MOSFET | 82% | 4.9 | 21.2 (24.0) |
| #3 | HCBGFET | 89% | 1.3 | 96.9 (230) |
| #4 | HCBGFET | 98% | 1.9 | 72.3 (240) |
| #3 | HCBGFET only normally-off | 58% | 1.8 | 55.5 (99.0) |
| #4 | HCBGFET only normally-off | 70% | 2.5 | 41.0 (75.0) |

In Table 2, the averages are given, with the highest effective surface channel mobility being given in parentheses. Ten columns and seven rows (less four corners) were probed=66 total.

Figure 15A:
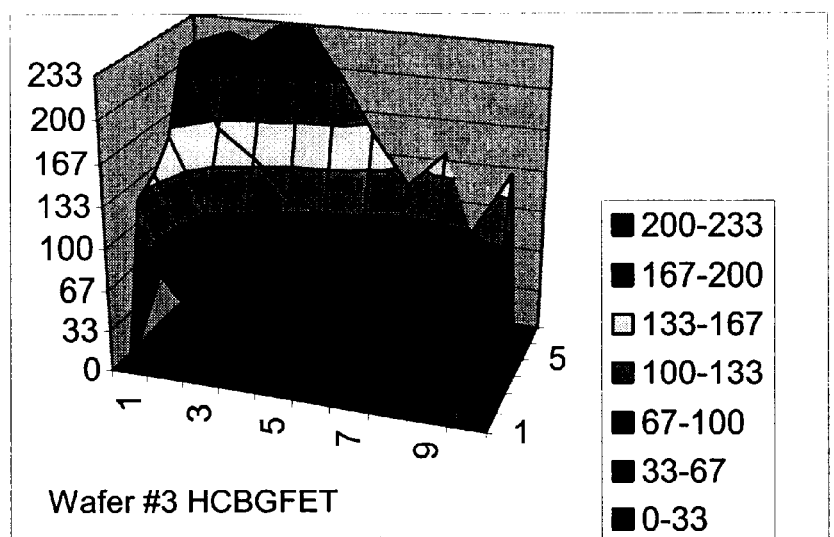
FIGS. 15A and 15B are graph s of the effective Surface Channel Mobility for horizontal channel buffered gate devices fabricated with $N_2O$ grown oxides according to embodiments of the present invention.
Figure 15B:
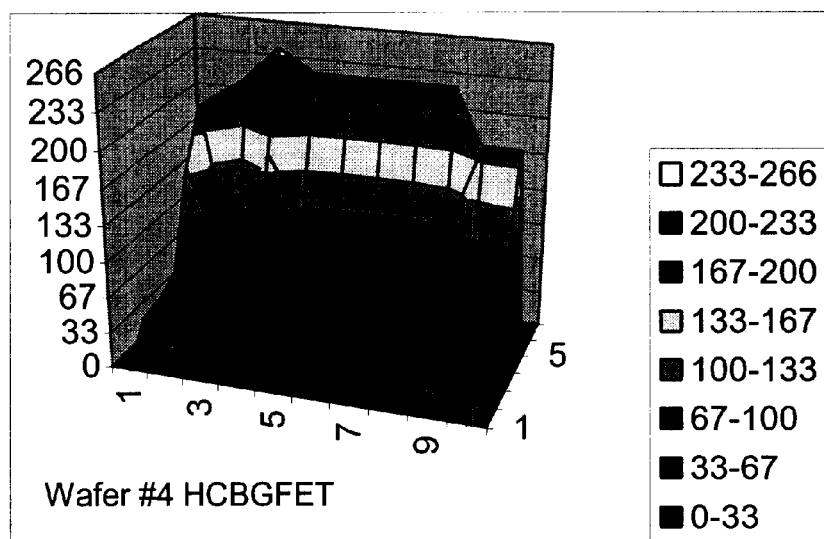

The horizontal channel buffered gate devices exhibited high effective surface channel mobilities, but the highest mobilities corresponded with normally-on devices, which is undesirable. More appropriate statistics are shown in the last two rows where all normally-on devices have been excluded from the calculations. Even eliminating the normally-on devices, the HCBGFET results indicate improvement over conventional oxide processes. One wafer exhibited an average effective surface channel mobility of 55.5 $cm^2$/V-s, with a maximum of 99 $cm^2$/V-s, while the other wafer has an average effective surface channel mobility of 41 $cm^2$/V-s, with a maximum of 75 $cm^2$/V-s. The variation is likely due to the variation in the doping of the epitaxial layer. This variation is shown in FIGS. 15A and 15B. FIGS. 15A and 15B illustrate the effective Surface Channel Mobility across Wafers #3 (FIG. 15A) and #4 (FIG. 15B). The doping was higher on the edge of the wafer, turning the device normally-on, and producing very high mobilities.

Figure 16A:
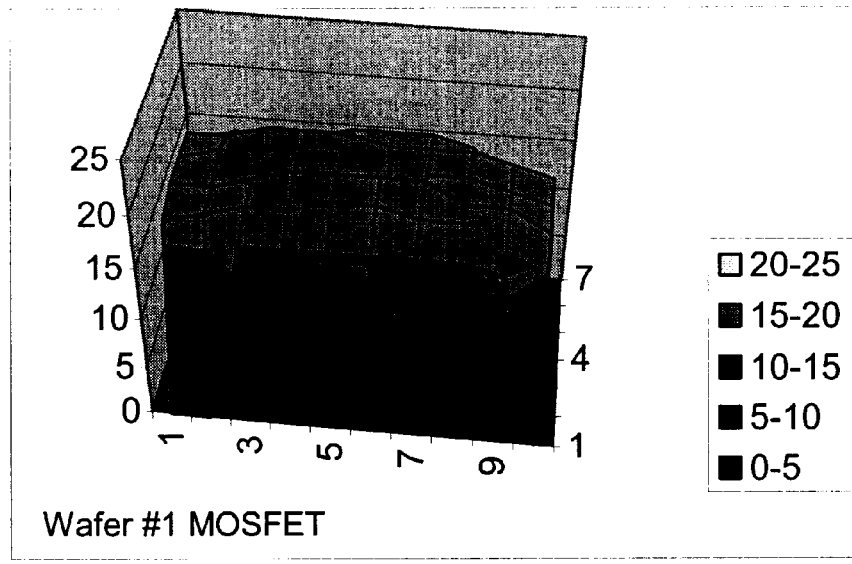
FIGS. 16A and 16B are graph s of the effective Surface Channel Mobility of lateral metal-oxide-semiconductor field effect transistors fabricated with $N_2O$ grown oxides according to embodiments of the present invention.
Figure 16B:
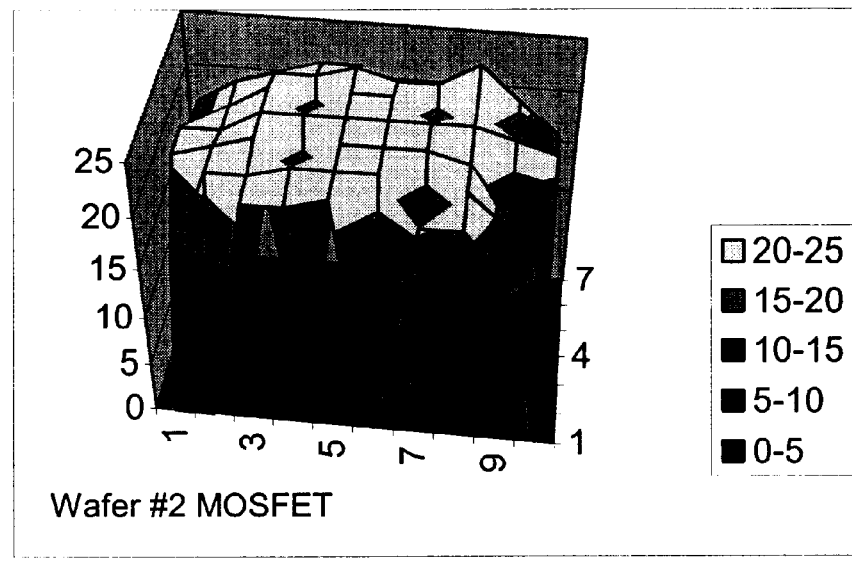

The lateral MOSFETs did not show the same degree of variation in mobility as the HCBGFETs as is shown in FIGS. 16A and 16B. FIGS. 16A and 16B are graphs of the effective Surface Channel Mobility across Wafers #1 (FIG. 16A) and #2 (FIG. 16B). As seen in FIGS. 16A and 16B, the mobility was very uniform across the wafer, except for the occasional non-yielding device. Typically, 4H—SiC MOSFETs with thermal or deposited oxides without NO or $N_2O$ processing typically had mobilities in the single digits. The reduction of interface states obtained by growing the oxide in $N_2O$ has effectively increased by a factor of tenthe surface channel mobility.

Figure 17A:
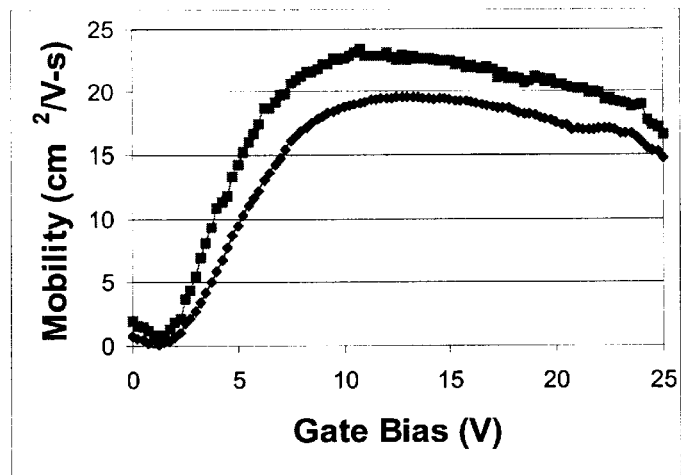
FIGS. 17A, 17B and 17C are graphs of effective channel mobility at different gate biases for devices having oxide layers fabricated according to embodiments of the present invention.
Figure 17B:
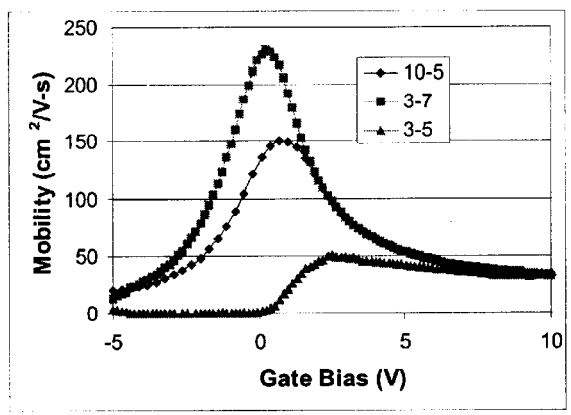
Figure 17C:
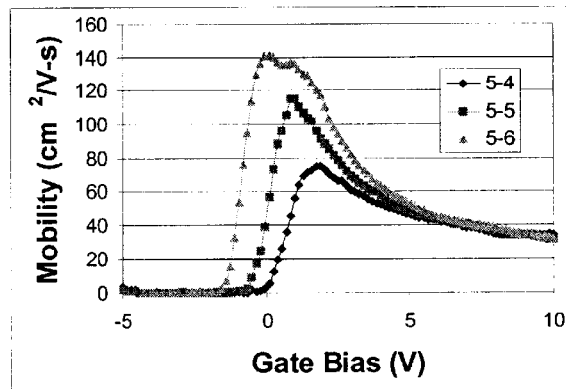

The mobility of these lateral MOSFETs may be important because the HCBGFET mobility is believed to be limited by this surface mobility at high fields. The mobility at different gate biases is shown in FIGS. 17A, 17B and 17C. Notice that at high gate biases, there is very little difference between the MOSFETs of wafers #1 and #2, in FIG. 17A, and the HCBGFETs of wafers #3 (FIG. 17B) and #4 (FIG. 17C).

As is illustrated in the above example, improved effective surface channel mobility may be provided in MOSFETs with gate oxides grown in $N_2O$. Standard lateral devices have mobilities around 20 $cm^2$/v-s. HCBGFET mobilities as high as 240 $cm^2$/v-s have been obtained on normally-on devices and 99 $cm^2$/v-s for normally-off devices. Furthermore, as is illustrated by FIGS. 3–17C above, through use of embodiments of the present invention, interface trap densities for oxide layers formed on silicon carbide may be reduced utilizing an $N_2O$ oxidation and/or anneal without the need for a subsequent wet $O_2$ anneal. Additionally, the $N_2O$ oxidation may be carried out with other gases in the ambient as described above. Also, $N_2O$ oxidation may be followed by $N_2O$ anneal as described in commonly assigned U.S. patent application Ser. No. 09/834,283, entitled "METHOD OF $N_2O$ ANNEALING AN OXIDE LAYER ON A SILICON CARBIDE LAYER", filed Apr. 12, 2001, the disclosure of which is incorporated herein by reference as if set forth fully herein.

In the drawings and specification, there have been disclosed typical preferred embodiments of the invention and, although specific terms are employed, they are used in a generic and descriptive only and not for purposes of limitation, the scope of the invention being set forth in the following claims.

That which is claimed is:

1. A method of fabricating a silicon carbide structure, comprising:

oxidizing a layer of silicon carbide in an environment comprising $N_2O$ using a predetermined temperature profile which includes an oxidation temperature of at least about 1200° C.; and wherein the step of oxidizing a layer of silicon carbide in an environment comprising $N_2O$, further comprises oxidizing the layer of silicon carbide utilizing a flow rate profile of $N_2O$ which includes a flow rate which provides an initial residence time of the $N_2O$ of at least about 11 seconds.

2. The method according to claim 1, wherein the initial residence time is from about 11 seconds to about 33 seconds.

3. The method according to claim 2, wherein the initial residence time is from about 19 seconds to about 22 seconds.

4. The method according to claim 1, wherein a total residence time of the $N_2O$ is from about 28 seconds to about 84 seconds.

5. The method according to claim 1, wherein a total residence time of the $N_2O$ is from about 49 seconds to about 56 seconds.

6. The method according to claim 1, wherein the flow rate profile provides a flow rate of from about 2 Standard Liters per Minute (SLM) to about 6 SLM.

7. The method according to claim 1, wherein the flow rate profile provides a flow rate of from about 3.5 to about 4 Standard Liters per Minute.

8. The method according to claim 1, wherein the step of oxidizing the silicon carbide layer is followed by the step of annealing.

9. The method according to claim 8, wherein the step of annealing is carried in at least one of an environment comprising Ar, an environment comprising $N_2$ and/or a hydrogen containing environment.

10. The method according to claim 9, wherein the step of annealing is carried out for about one hour.

11. The method according to claim 1, wherein the predetermined flow rate provides a velocity of the $N_2O$ of from about 0.37 cm/s to about 1.11 cm/s.

12. The method according to claim 11, wherein the predetermined flow rate provides a velocity of the $N_2O$ of from about 0.65 cm/s to about 0.74 cm/s.

13. The method according to claim 1, wherein the step of oxidizing the silicon carbide layer comprises oxidizing the silicon carbide layer in an environment comprising $N_2O$ including at least one of oxidizing agents and/or inert gases.

14. The method according to claim 13, wherein the oxidizing agents comprise at least one of steam and/or $O_2$.

15. A method of fabricating a silicon carbide structure, comprising:

oxidizing a layer of silicon carbide in an environment comprising $N_2O$ using a predetermined temperature profile which includes an oxidation temperature of at least about 1200° C.; and then annealing the oxidized layer of silicon carbide in an environment comprising $N_2O$ at an anneal temperature of greater than about 1100° C.

16. The method according to claim 1, wherein the silicon carbide layer comprises 4H polytype silicon carbide.

17. The method according to claim 1, wherein the silicon carbide layer comprises a silicon carbide layer on a non-silicon carbide substrate.

18. The method according to claim 1, wherein the silicon carbide layer comprises a portion of a silicon carbide substrate.

19. The method according to claim 1, wherein the oxidation temperature is about 1300° C.

20. The method according to claim 19, wherein the step of oxidizing the silicon carbide layer is followed by the step of annealing.

21. The method according to claim 20, wherein the step of annealing is carried in at least one of an environment comprising Ar, an environment comprising $N_2$ and/or a hydrogen containing environment.

22. The method according to claim 20, wherein the step of annealing is carried out for about one hour.

23. The method according to claim 19, wherein the step of oxidizing the silicon carbide layer comprises oxidizing the silicon carbide layer in an environment comprising $N_2O$ including at least one of oxidizing agents and/or inert gases.

24. The method according to claim 23, wherein the oxidizing agents comprise at least one of steam and/or $O_2$.

25. The method according to claim 19, wherein the step of oxidizing the silicon carbide layer is followed by the step of annealing in an environment comprising $N_2O$ at an anneal temperature of greater than about 1100° C.

26. The method according to claim 19, wherein the silicon carbide layer comprises 4H polytype silicon carbide.

27. The method according to claim 19, wherein the silicon carbide layer comprises a silicon carbide layer on a non-silicon carbide substrate.

28. The method according to claim 19, wherein the silicon carbide layer comprises a portion of a silicon carbide substrate.

* * * * *

UNITED STATES PATENT AND TRADEMARK OFFICE
CERTIFICATE OF CORRECTION

PATENT NO. : 6,767,843 B2
DATED : July 27, 2004
INVENTOR(S) : Lipkin et al.

It is certified that error appears in the above-identified patent and that said Letters Patent is hereby corrected as shown below:

Column 1,
Line 11, should read -- U.S. patent application Ser. No. 09/834,283, now United States Patent No. 6,610,366, filed Apr. 12, --
Line 22, should read
-- Statement of Government Interest
The present invention was made, at least in part, with support from United States Air Force Research Laboratory contract number F33615-99-2914. The government may have certain rights in this invention. --

Column 11,
Line 8, should read -- ...now United States Patent No. 6,610,366, entitled "METHOD OF $N_2O$ ANNEALING AN --

Signed and Sealed this

Twenty-fifth Day of January, 2005

JON W. DUDAS
*Director of the United States Patent and Trademark Office*